United States Patent [19]

Partovi et al.

[11] Patent Number: 5,546,354
[45] Date of Patent: Aug. 13, 1996

[54] STATIC RANDOM ACCESS MEMORY HAVING TUNABLE-SELF-TIMED CONTROL LOGIC CIRCUITS

[75] Inventors: Hamid Partovi, Sunnyvale, Calif.; Steven Butler, Marlboro, Mass.; Luan Tran, San Jose, Calif.

[73] Assignee: Digital Equipment Corporation, Maynard, Mass.

[21] Appl. No.: 270,190

[22] Filed: Jul. 1, 1994

[51] Int. Cl.$^6$ ................................... G11C 7/00
[52] U.S. Cl. .................. 365/233; 365/233.5; 365/194
[58] Field of Search .................. 365/233, 230.01, 365/189.01, 233.5, 190, 191, 194

[56] References Cited

U.S. PATENT DOCUMENTS 5,327,394  7/1994  Green et al. ........................ 365/233
5,402,389  3/1995  Flannagan et al. .................. 365/233

*Primary Examiner*—David C. Nelms
*Assistant Examiner*—Vu A. Le
*Attorney, Agent, or Firm*—Denis G. Maloney; Arthur W. Fisher

[57] ABSTRACT

A self-timed logic device which produces internal control and timing signals in response to an external signal is described. The circuit includes means responsive to a pulse signal for providing control and timing signals and means responsive to a change in state of a signal fed to said device for providing said pulse signal. The means for providing said pulse further includes means for selectively changing timing characteristics of said device in response to external tuning signals fed to the device. In a preferred embodiment the logic device is a static random access memory.

5 Claims, 5 Drawing Sheets

STATIC RANDOM ACCESS MEMORY HAVING TUNABLE-SELF-TIMED CONTROL LOGIC CIRCUITS

BACKGROUND

This invention relates generally to semiconductor integrated circuits and more particularly to self-timed digital logic circuits.

As is known in the art, modern computer systems and other types of digital systems employ logic circuits including microprocessor and memories to implement various functions in a digital manner. One type of logic circuit uses control logic which is self-timed. That is, the logic circuit uses no external reference synchronization signal commonly referred to as a clock signal but rather detects an occurrence of an event to start a control sequence to assert and de-assert as necessary control signals to control a particular logic circuit. An example of a logic circuit which employs self-timed control logic is the static random access memory.

As it is known, a static random access memory is employed in computer systems particularly in cache memories of computer systems to provide quick yet random access to stored data. A typical standard static random access memory (SRAM) comprises address and data interface circuits and control logic which provides self-timed signals to address and enable a memory array which is typically comprised of a very large plurality of static storage cells. In a SRAM during either a read or write to the memory an address is fed to an address decoder in the SRAM to provide row and column address signals to address the memory array. The address is also fed to a pulse generator circuit to generate a pulse of controlled pulse width in response to a change in one of the address signals. This pulse of controlled pulse width is used to initiate a control and timing sequence which provides enable signals to the array to enable data to be stored in the array or read from the array in accordance with a particular memory operation. Since the pulse is initiated by detecting a change in one or more of the address bits fed to the SRAM and no other external signal is fed to the SRAM to initiate the control and timing sequence, the circuit is self-timed.

Generally in self-timed circuits once a change has been detected such as an address edge in a SRAM, the pulse generator provides a pulse to initiate the control and timing sequence and enable the memory array to read or write data.

One problem which arises with such circuits is that the timing is very critical. In the event that a valid address is not presented at the output of the address decoder such that the address decoder has provided valid signals on the row and column address lines by the time that the self-timed circuits are activated, data which is to be written to the array will be written at an incorrect location or data which is read from the array will be read from an incorrect location. In either event there will be a faulty memory access.

Generally in self-timed SRAM's, several sources of problems can effect the operation of the SRAM. These differences can arise because of variations in processing conditions between different lots of devices or amongst devices in the same lot. These variations may also arise due to design tolerances being exceeded in actual circuit fabrication.

The first consideration is the decoding of the address lines to the device. If propagation delays through the address decoder are different for different paths and are different between different devices and different lots of such devices, the row and column address lines to the memory array may not be valid at the time that the control and timing circuitry in the device institutes the timing sequence.

A second problem arises when the pulse width of the pulse which initiates the self-timing sequence is too short or to long. If the pulse is too short the memory array may not read or write valid data, whereas if the pulse width is too long the cycle time or period of time at which memory can perform read or write operations is lengthened which is generally undesirable, particularly for high performance systems.

Moreover, the pulse generally has a fixed relationship to the address decoding and enabling of the memory array. Generally the first or leading edge of the pulse is asserted before the address decoding, whereas by the last or trailing edge of the pulse the address must be valid and decoded to provide the proper row and column address signals (since this edge is used to time those control signals used to activate or enable the memory array). This timing sequence can not be interrupted so that it is necessary to ensure that the addresses are valid at the memory array.

A third problem associated with the SRAMs is that the output driver which couples data from the array to a user device such as a bus, is preferably designed to sink or source, depending on the sense of the output driver, relatively high levels of current. For common devices, a large MOS device is used to sink high levels of current. This is desirable because it increases the speed of operation of the memory device. However, if the current sunk is too high a problem occurs since it raises/lowers the levels of the voltages on the power and reference voltage lines. The bouncing of the voltages on these lines can initiate another memory cycle and can lead to oscillations in the memory device. Further, the changes the levels of voltage could cause reduction in noise margin thus corrupting data from the device.

SUMMARY OF THE INVENTION

In accordance with the present invention, a self timed logic device which produces internal control and timing signals in response to an external signal includes means responsive to a pulse signal for providing control and timing signals and means responsive to a change in state of a signal fed to said circuit for providing said pulse signal. The means for providing said pulse further includes means for selectively changing timing characteristics of said device in response to external tuning signals fed to the device. With such an arrangement, by providing means to adjust timing relationships within a self-timed logic circuit the operation of the circuit can be optimized and variations occasioned by processing and design tolerances can be compensated for. Moreover, since the timing relationships can be adjusted, the tolerances used by the designer can be relaxed in an attempt to provide maximum performance from the circuit. Relaxation of such tolerances is possible since for those devices which do not meet specification due to processing variations, the tuning can be used to provide operable devices albeit at lower performance levels yet the overall acceptable yield of operable devices can be maintained.

In accordance with a further aspect of the present invention, a static random access memory includes an array of memory cells arranged in a plurality of columns and rows and a control and timing logic circuit to provide control signals to said memory array in response to a pulse signal. The memory also includes an address decoder responsive to address signals provided to said memory device to produce row and column signals for said memory array and a pulse generator circuit responsive to said address signals fed to said memory device for producing a pulse signal to said control and said timing logic. The memory also includes means for selectively changing timing characteristics of said memory in response to external tuning signals fed to the memory. With such an arrangement, selective timing signals of the memory can be adjusted to compensate for variations due to processing, operating conditions, and so forth.

In one embodiment, the means includes a circuit to delay address bits being presented to the address decoder.

In an alternate embodiment the means includes a circuit to control the drive impedance of the output driver in the memory.

In a third embodiment the means includes a circuit disposed within the pulse generator to provide the pulse having a selectable pulse width in accordance with the control signals fed to the memory.

Preferably all three embodiments are included in the memory device. This permits various characteristics of the device to be adjusted so that a higher level of operable devices are provided.

BRIEF DESCRIPTION OF THE DRAWINGS

The above mentioned and other features of the invention will now become more apparent by reference to the following description taken in connection with the accompanying drawings in which.

DESCRIPTION OF THE PREFERRED EMBODIMENTS

Figure 1:
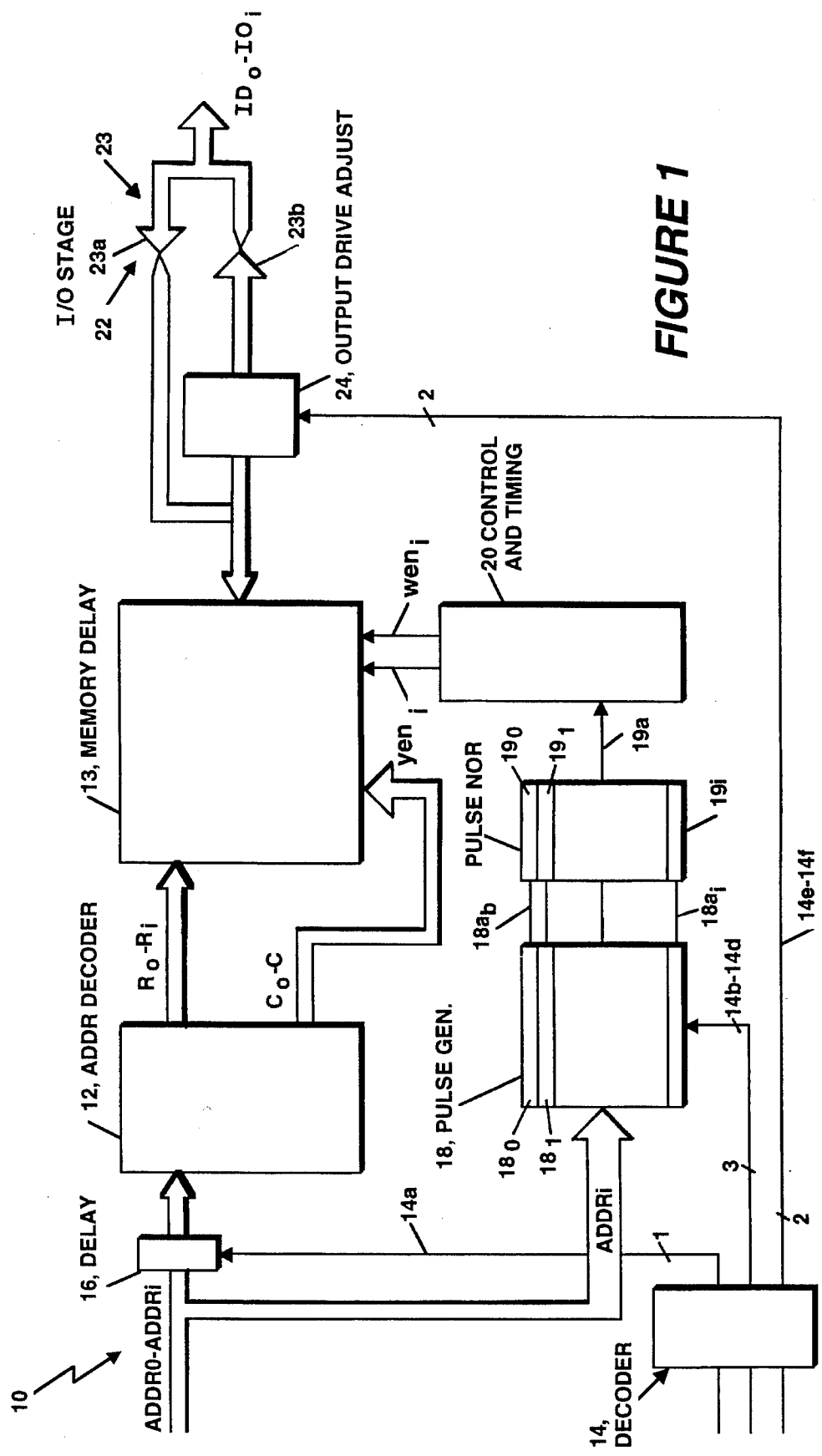
FIG. 1 is a block diagram of a static random access memory.

Referring now to FIG. 1, a static random access memory (SRAM) 10 is shown as an example of a self-timed logic device, and is shown to include an address decoder 12 which is fed via address signals on address lines $ADDR_0$-$ADDR_i$ with the number of such address lines being in accordance with the number of addressable locations in the memory 10. The decoder responsive to the signals on the address lines $ADDR_0$-$ADDR_i$, provides at the output thereof signals on the row address lines $R_0$-$R_i$ and column address lines $C_0$-$C_i$, as shown. The row and column address lines are fed to a corresponding plurality of gates (not shown) which have as an additional input to each of the gates, address enable strobes or signals $Y_{eni}$, $W_{eni}$ provided from control and timing circuit 20. The output of such gates are coupled to a memory array 13.

The memory array 13 being a conventional array is comprised of a large plurality of static storage cells with each of said cells typically comprised of a pair of cross coupled inverters and a pair of pass transistors. Each of the cells (not shown) are interconnected via word lines (not shown) provided via the output signal lines $W_{eni}$ of the enable gates mentioned above. Thus the word lines are controlled by the row address lines. The array is also addressed via bit lines coupled to the pass transistors (not shown). The pass transistors are enabled via the column address lines and bit line enables $Y_{eni}$. This permits data to written and read from the array at selected ones of said cells in accordance with the address fed to the memory and as decoded to provide the appropriately enabled row and column lines. Any conventional memory array comprised of conventional storage elements could alternatively be used.

The memory 10 further includes a pulse generator circuit 18 which produces a pulse of controllable and selectable pulse width in response to a change in the logic states of any of the signals on the address lines $ADDR_0$-$ADDR_i$. The pulse generator 18 thus is comprised of an individual circuit $18_0$ to $18_i$ for each one of the address lines $ADDR_0$-$ADDR_i$, and a single NOR pulse gate $19_0$ to $19_i$ for each of the pulse generators 18. The outputs of each of the NOR pulse circuits 19 are coupled together and are coupled to the control and timing logic circuit 20. A change in any one of the address lines $ADDR_0$-$ADDR_i$ coupled to the corresponding one of the pulse generator circuits 18 provides a pulse at the output of that pulse generator $18_0$ to $18_i$ and accordingly at the corresponding one of the NOR circuits $19_0$ to $19_i$. This pulse of selectable and controllable width is used to initiate timing in the control and timing logic 20. Accordingly, the pulse is used to indicate a change in any one or more of address signals on address lines $ADDR_0$-$ADDR_i$ fed to the memory 10. The pulse signal fed to the control and timing logic circuit 20 provides in response to a trailing edge enable signals $W_{ei}$ which are the word or row enable signals fed to the row address enable gates (not shown) and the $Y_{Eni}$ which are enable signals for the bit line or column addresses used in the array.

The array 13 is coupled to a input/output stage 22 which is comprised of a bus transceiver 23 including a bus receiver 23a and a bus driver 23b. The bus transceiver 23 interfaces the memory array 13 and hence memory 10 to a data bus $IO_0$-$IO_i$.

Figure 3:
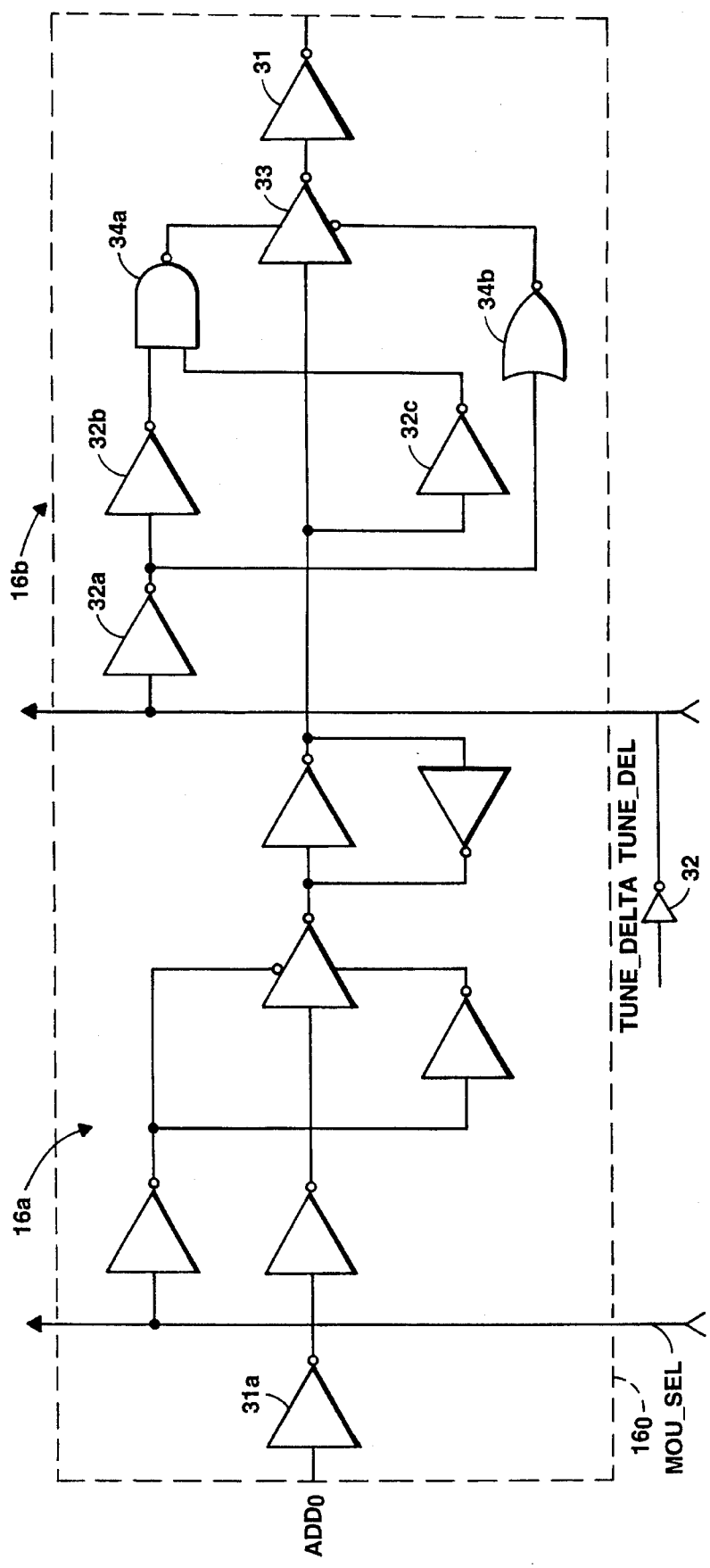
FIG. 3 is a logic schematic diagram of an address bit selectable delay line used in the memory of FIG. 1.

In order to compensate for delay variations resulting from manufacture of the memory 10, a delay circuit 16 is interposed between the address lines ADDR0-ADDRI and the address decoder 23. The delay circuit 16, as will be further discussed in conjunction with FIG. 3, is used to impart a selectable delay to the address signals to delay address decoding via decoder 12 and thus application of the resulting row and column addresses to the memory array 13.

Figure 4:
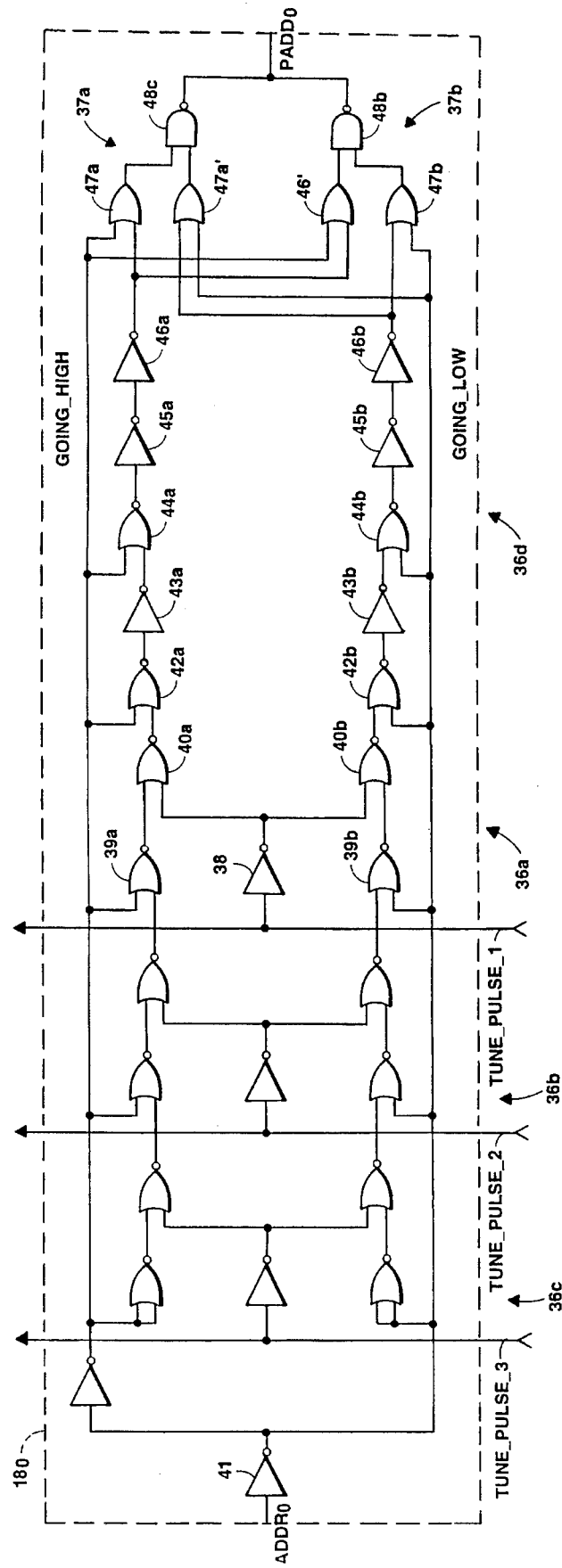
FIG. 4 is a logic schematic diagram of pulse generator having a circuit to provide a selectable pulse width used in the memory of FIG. 1.

A second feature provided in the invention is to include a circuit to permit a variable pulse width from the pulse generator 18 as will be further described in conjunction with FIG. 4. This permits variation in the pulse width provided from the pulse at the output line 19a and thus is used to adjust the self-timing characteristics of the control and timing circuit 20.

A third feature provided in this arrangement is an output driver adjust circuit 24 coupled between the memory array 13 and the driver 23b of output stage 22. The output driver adjust circuit 24 is used to increase or decrease the drive to the input of the bus driver 23b to thus control the amount of current the bus driver for each of the output lines sinks or sources when changing the state of data on the respective signal lines of bus IO.

Figure 2:
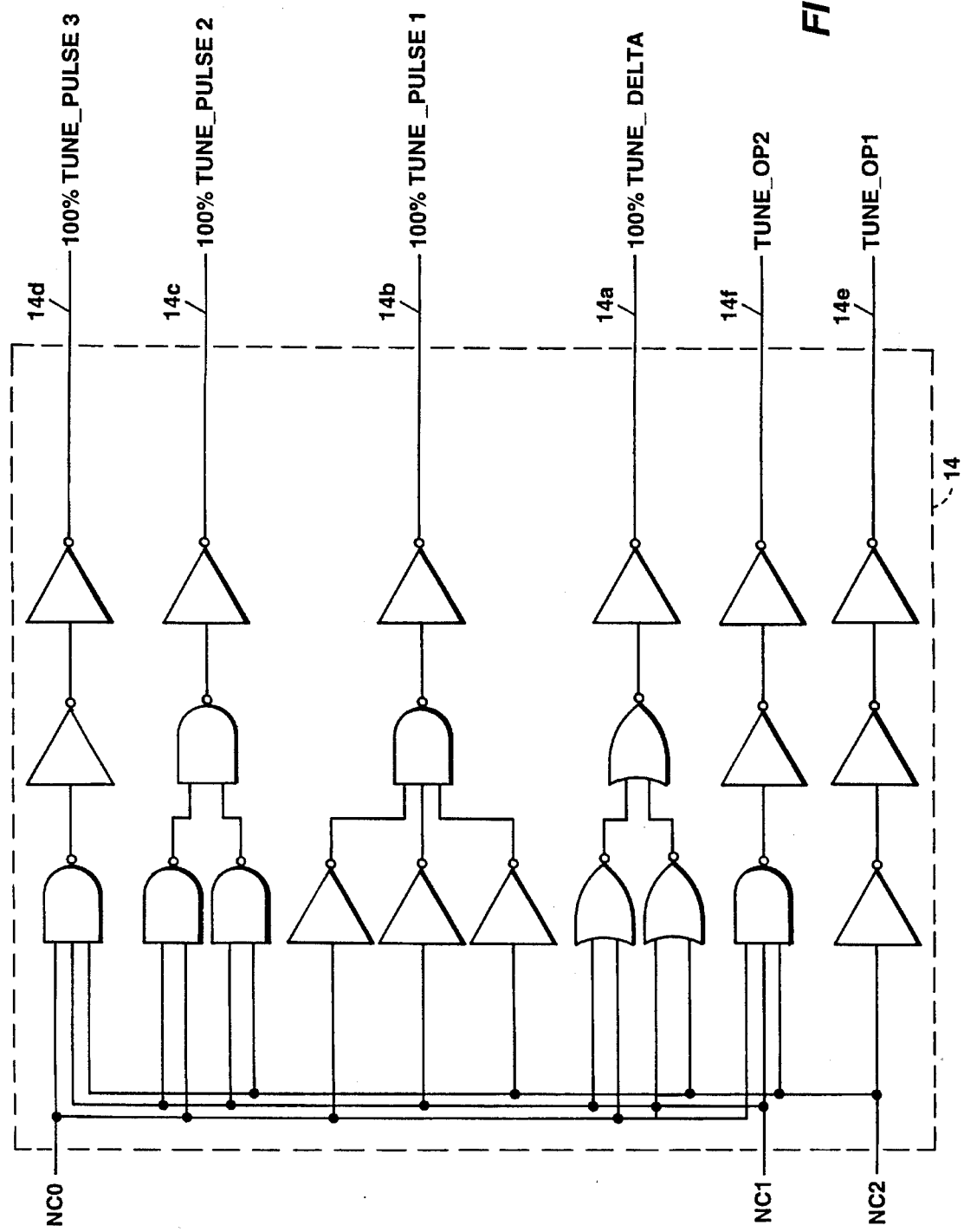
FIG. 2 is a logic circuit diagram of a decoder used in the memory of FIG. 1.

The memory device 10 further includes a second decoder 14. The decoder 14 as described in conjunction with FIG. 2, is a 3 to 8 decoder with only six states being used. The decoder 14 has inputs here connected to the normally unconnected or no connect pins (NC) pins of a typical standard memory package (not shown). The decoder 14 is used to provide here illustratively 6 signals which can be used to control or enable the circuits 16, 18, and 24. Thus, the signal on line 14a is used to adjust the delay of the addresses provided to address decoder 12, signals on lines 14b–14d are used to successively increase the pulse width provided from the output of pulse generator circuits $18_0$-$18_i$, and two signals on lines 14e and 14f are used to provide two selectable output drive levels to the output drive adjust circuit 24. Thus, by judicious choice of signals either the delay for address decoding, pulse width of the pulse from the pulse generator, or level of the drive controlling the output drivers can be adjusted.

These parameters of the SRAM can be adjusted to provide an operating device and compensate for variations in the characteristics of operating devices such that devices which are out of specification can be adjusted to become within specification albeit at a lower performance level.

Referring now to FIG. 2, the decoder 14 is shown coupled to pins $NC_0$-$NC_2$ which are non-connected pins of a standard JEDEC packaged 1 Mbyte SRAM. Using conventional decoder techniques the decoder provides here 6 signals. At the output of the decoder 14 is provided signals TUNE_DELTA via line 14a which is fed to the delay circuit 16 (FIG. 1) and is used to delay the addresses fed to the address decoder 12. The decoder further includes signals TUNE_PULSE1_TUNE PULSE3 which are fed via lines 14b–14d and are provided to the pulse generator circuits 18. Signals TUNE_PULSE1-TUNE PULSE are used to selectively change the pulse width of the pulse produced by the pulse generator 18. The decoder 14 further provides signals via lines 14e and 14f which are TUNE_OP1-TUNE_OP2 and are used to selectively tune the output drive control signal provided to each of the drivers on the output lines of the memory 10. Thus by selectively coupling of the non-connected pins NC0-NC3 at the package level or alternatively by permanently connecting those pins by a masking process in silicon selective tuning in one of the aforementioned areas of the memory device 10 is accomplished.

Therefore, several arrangements can be used with the NC pins. For example, if the NC pins are not used for any application in the circuit that is, they are neither used for test or other purposes, the NC pins can be connected by a user of the device to "dial in" optimal performance characteristics for the memory. Where the NC pins are used in the beginning stages of testing to insure functionality at some operating speed of the memory device, the NC pin connections can be used to examine various speed limitations of the part in so called prototype testing. Thereafter, after sufficient data has been determined concerning the relative yields of the design and process used to fabricate the parts, optimal mask options of the NC pins can be used to optimally select one of the aforementioned options for tuning. In the event that additional pins are accessible to the package and the decoder can be eliminated or expanded it may be possible therefore to select one option for each of the tunable regions of the device and of course other tunable regions of the device may alternatively be provided.

Referring now to FIG. 3, a circuit 16 representative of each of the circuits interposed between each of the address lines $ADDR_i$ and the address decoder 12 (FIG. 1) is shown to include a latch portion 16a and a delay circuit portion 16b. The latch portion 16a is a generally conventional circuit which is used to latch data on the address bus ADDR. The latch portion 16a is under the control of signal MOD_SEL which selectively permits the data to be fed to the delay circuit 16b during such period of time as the address is changing and valid on the address bus (not shown).

The delay circuit portion 16b of the delay circuit 16 includes three paths provided to a tri-state element 33. The first path is provided via inverters 32a–32c and a NAND gate 34a. The second path is provided via inverters 32a, 32c and a NAND gate 34b. The third path is provided directly into the tri-state element 33. When signal tune_DELTA is asserted at the output of decoder 14 (FIG. 2), the signal is inverted via an inverter 32 and fed as signal tune_DEL to each of the circuits 16 for each of the address bits $ADDR_0$-$ADDR_j$. Assertion of tune delay_L enables the first and second paths to the tri-state element 33 by placing a logic 1 at the output of gate 34a and a logic 0 at the output of gate 34b. This inhibits the application of the address bit from line $ADDR_0$, via the latch portion 16a, from the output of the tri-state device 33. Rather, the signal is delayed until $ADDR_0$ propagates through the additional gate delay of gates 34a and 34b. Therefore, this circuit selectively delays the address bit and is used to slow down the address decoding relative to generation of the pulse via circuit 18 for those devices which do not meet various address setup time requirements.

Referring now to FIG. 4, the illustrative pulse generator circuit $18_0$ is shown to include pulse width adjustments sections 36a–36c, of which section 36a will be described as an illustrative example. Each one of the sections is comprised of an inverter 38 coupled to a corresponding one of the outputs of the decoder 14 here TUNE_PULSE_$_1$. The sections 36a–36b include a pair of NOR gates 39a–39b which are fed via a preceding one of the pulse adjustments circuits 36b, 36c and a second pair of NOR gates 40a, 40b which are fed via the output of the inverter 38 and the outputs of the preceding NOR gates 39a, 39b as shown. The output of the NOR gates 40a 40b are fed to either the next succeeding pulse adjustment stage 36b, 36a, or as for here the output is fed to the pulse-generator 36d.

The pulse generator 36d includes a pair of signal paths "GOING HIGH" and "GOING LOW" and thus maintains a symmetry provided in the preceding pulse adjustment circuits 36a–36c. The pulse generator 36d is used to detect the going high or going low edges of the signal provided to the address line $ADD_0$. Noting that if all of the TUNE_PULSE signals, that is TUNE_PULSE_1-TUNE_PULSE_3 are not asserted the output of gate 40a and 40b will be at a logic 0 level thus inhibiting the pulse adjustment circuits from effecting the pulse provided from the pulse generator 36d.

The pulse generator 36d includes NOR gates 42a, 42b having an input coupled to the data lines GOING HIGH, GOING LOW and a second input coupled to the aforementioned NOR gates 40a and 40b. The outputs of the NOR gates 42a, 42b are coupled to respective inverters 43a, 43b and to one input of a pair of NOR gates 44a and 44b with the other input likewise coupled to the respective data lines $ADDR_0$, $ADDR_0$_L. The output of NOR gates 44a, 44b are coupled to respective inverters 45a, 45b and 46a, 46b as shown with the output of inverters 46a, 46b coupled to one input of a NOR gate pair 47a, 47b' and with the output of inverter 46b coupled to one input of NOR gate pair 47a' and 47b. The remaining input of NOR gates 47a are coupled to the data lines GOING HIGH, GOING LOW which provide the remaining connections to devices 47a and 47b' as shown. The outputs of each of the inverter pairs, NOR gate pairs 47a, 47a' and 47b, 47b' are coupled to inputs of NAND gates 48a and 48b and with the outputs of these devices wired together to provide output signal PADD0. Signal PADD0 is coupled to each of the remaining signals from other ones of the pulse generator circuits $18_i$ to provide a wired NOR function and thus provide a pulse of controlled pulse width to timing and control logic 20 (FIG. 1).

By asserting one of signals TUNE_PULSE1-TUNE_PULSE3 the corresponding one and all preceding ones of the pulse adjustment stages 36a–36c is enable. When enabled, the delay associated with the gates in each one of the stages is added to form the pulse of controlled and selected pulse width. Thus by selection of the signals TUNE_PULSE1-TUNE_PULSE3 successively increasing values of pulse width are imparted to the pulse provided at PADD0.

Circuit $18_0$ operates as follows. When a signal edge is asserted on line ADDR0, that is when the signal changes state, the signal on line $ADDR_0$ propagates through each of the devices coupled to line GOING HIGH and line GOING LOW_L from the output of the inverter 41 propagates to each of the devices coupled thereto. The signals GOING HIGH and GOING LOW are also coupled through the last of the NOR gate pairs in the pulse width tune section 36c. Thus, if that section is enabled one of the edges, depending upon whether the edge transitions low or high propagates through all of the interposed gates to reach the last NOR gate 47a and thus assert or enable the NOR gate and provide at the output of the NOR gate 47a a signal which is fed to the NAND gate 48a.

A similar arrangement is provided to the other input of the NAND gate 48a for the opposite edge of the signal thus assuring that whether $ADDR_0$ originally goes from high to low or from low to high that the edge of the pulse generated by NAND gate 48a will be responsive to either state of $ADDR_0$. A similar arrangement is provided for the going low state of $ADDR_0$ via NOR gate 47b, 47b.

In the event that none of the signals TUNE_PULSE1-TUNE_PULSE3 are asserted then the pulse width adjustment stages 36a–36c are not activated and the outputs of gates 40a–40b will provide a logic low level at gates 42a, 42b. The outputs of gates 42a, 42b will follow the state of $ADDR_0$ and propagate the edge change through the pulse width generator 36d.

In the event that one of the signals TUNE_PULSE1-TUNE_PULSE 3 is asserted then the corresponding pulse width adjustment stages 36a–36c and all succeeding ones of the stages are activated and the outputs of gates 40a–40b will provide a logic high level at gates 42a, 42b. Accordingly, the pulse generator 36d will only be activated when the corresponding stage and all succeeding one of the stages propagates the change in the state of the address line. Thus, assertion of signals TUNE_PULSE 1-TUNE_PULSE 3 permits an increase in the pulse width of two, four or six gate delays.

Figure 5:
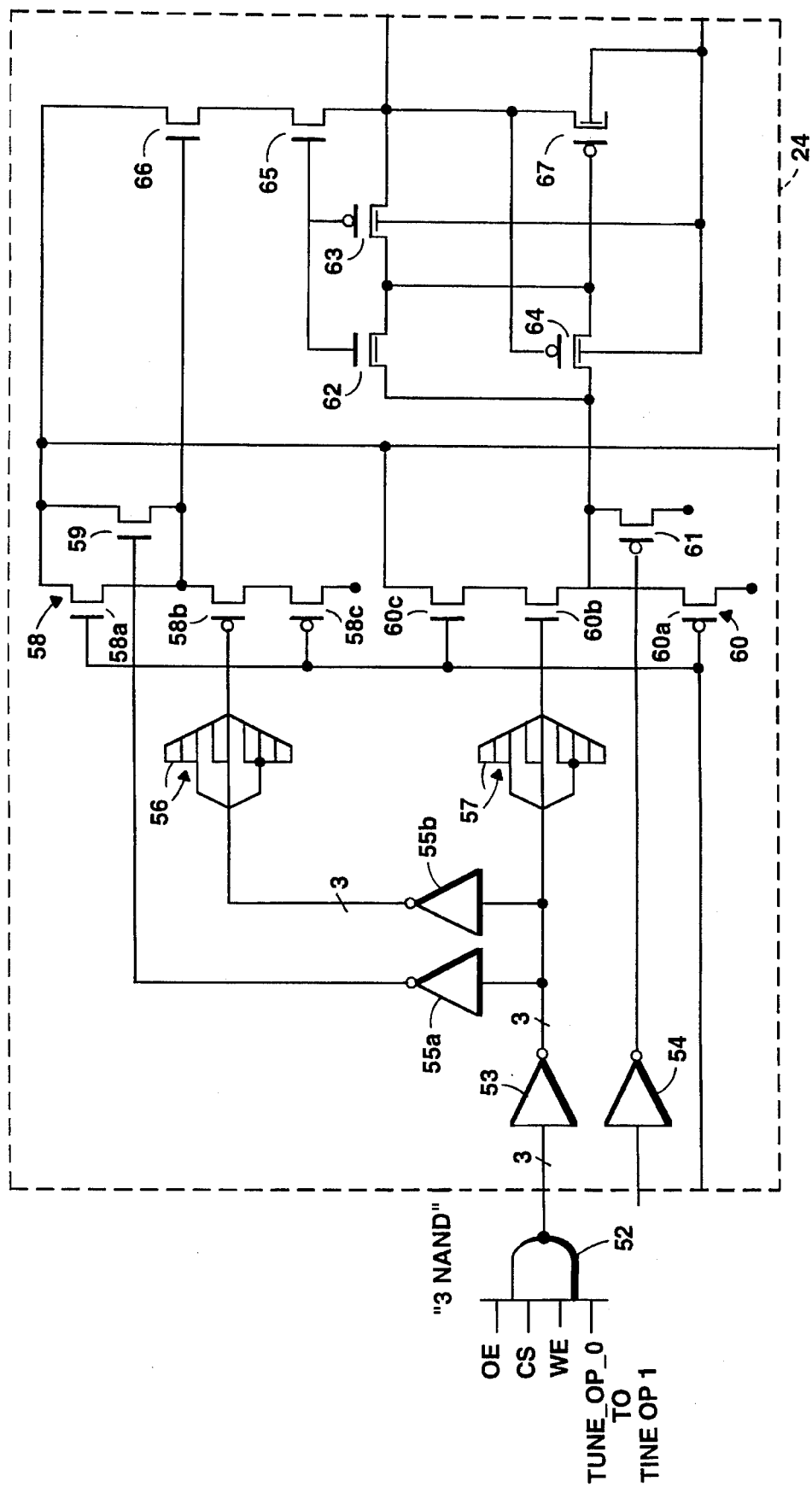
FIG. 5 is a schematic diagram of an output driver having a circuit to provide a selectable driver control to the driver and used in the memory of FIG. 1.

Referring now to FIG. 5, the output driver circuit 24 is shown to include a stack of three NAND gates generally represented as element 52 each coupled to a signal "OE" or output enable "CS" chip select and output signal "WE" and one of signals TUNE_OP_0-TUNE_OP_1. The signals from the NAND gates 52 are used as enables for the elements 56, 57 as will be described.

During normal operation of the output driver without tuning, the driver defaults to a lower drive level. The outputs of the three gates 52 are coupled to three corresponding inverters 53 and provide signals to three further corresponding inverters 55b. An additional signal is provided via inverter 54 which is fed by an output disable signal provided by a similar arrangement as the 3 NAND gate arrangement 52, except that the fourth input to the NAND gate is a logic 1.

Signals from inverters 53 and 54 are coupled to devices 56 and 57 as shown having outputs coupled to transistor 58b and 60b in respective transistor stacks 58 and 60. The stacks 58 and 60 respectively include transistors 58a–58c and 60a–60c coupled as shown. The output of the stacks provide drive signals to the output driver comprised of transistors 62–66 as shown.

In particular, when one of signals TUNE_OP_1 or TUNE_OP_2 is asserted, the appropriate inverter of one of inverters 53 will provide a signal to device 56 and 57 increasing the gate drive to the respective device 58b and 60b and thereby increasing the gate drive on transistor 65 and 67 which here are the devices used sink current from the output line OUT as well as source current from the line OUT in accordance with the state of the device.

Having described preferred embodiments of the invention it will now become apparent to one of ordinary skill in the art that other embodiments incorporating their concepts may be used. Accordingly, it is submitted that the invention should not be limited to the disclosed embodiments but rather should be limited only by the spirit and the scope of the appended claims.

What is claimed is:

1. A static random access memory comprising:

an array of memory cells arranged in a plurality of columns and rows;

a control and timing logic circuit to provide control signals to said memory array in response to a pulse signal;

an address decoder responsive to address signals provided to said memory device to produce row and column signals for said memory array;

a pulse generator circuit responsive to address signals provided to said memory device for providing a pulse signal to said control and said timing logic; and means for selectively changing timing characteristics of said memory in response to external tuning signals fed to the memory.

2. The memory of claim 1 wherein said means comprises:

a delay circuit interposed between said address lines and said address decoder for delaying application of address signals on the address line to said address decoder in accordance with a control signal fed to said delay circuit.

3. The memory of claim 2 wherein said means comprises:

a output driver adjust circuit coupled between said memory array and an output driver device for selectively increasing an output drive signal level to said driver in accordance with a control signal fed to the delay circuit.

4. The circuit of claim 3 wherein said means is disposed in said pulse generator circuit and said means comprises:

means for selectively increasing the pulse of the signal provided from said pulse generator circuit in accordance with control signals fed to the pulse generator circuit.

5. The circuit of claim 4 further comprising:

a decoder coupled to external control signals to provide each one of said control signals to the means.

* * * * *